(12) United States Patent
Quilter

(10) Patent No.: US 7,279,967 B2
(45) Date of Patent: Oct. 9, 2007

(54) MULTI-CHANNEL, MULTI-POWER CLASS D AMPLIFIER WITH REGULATED POWER SUPPLY

(75) Inventor: Patrick H. Quilter, Laguna Beach, CA (US)

(73) Assignee: QSC Audio Products, Inc., Costa Mesa, CA (US)

( * ) Notice: Subject to any disclaimer, the term of this patent is extended or adjusted under 35 U.S.C. 154(b) by 81 days.

(21) Appl. No.: 11/330,644

(22) Filed: Jan. 12, 2006

(65) Prior Publication Data

US 2006/0186955 A1 Aug. 24, 2006

Related U.S. Application Data

(60) Provisional application No. 60/643,733, filed on Jan. 12, 2005.

(51) Int. Cl.
*H03F 3/38* (2006.01)
(52) U.S. Cl. .................... 330/10; 330/251
(58) Field of Classification Search ............... 330/10, 330/207 A, 251
See application file for complete search history.

(56) References Cited

U.S. PATENT DOCUMENTS 6,563,377 B2 * 5/2003 Butler ................. 330/10
7,138,864 B2 * 11/2006 Mazda ................ 330/251
7,167,046 B2 * 1/2007 Maejima ............. 330/207 A \* cited by examiner

*Primary Examiner*—Henry Choe
(74) *Attorney, Agent, or Firm*—Perkins Coie LLP

(57) ABSTRACT

Methods and apparatus are disclosed to reduce the size, weight, and heat loss of power modules mountable in loudspeakers. Disclosed embodiments replace conventional linear technology with high frequency switching technology in both the power supply and amplifier. In these embodiments Class-D switching occurs at a low and fixed frequency, using standard components, with audio performance improvements through adaptation of internal error correction. By permitting 100% modulation, maximum output power is obtained, and a simple clip-detecting scheme is possible. A half-bridge and full-bridge with a single main supply reservoir is disclosed, obtaining useful allocation of output power while enabling the use of a simplified power supply. Power supply improvements include simplification and high efficiency, while meeting the particular system requirements of this scheme. Advantages include: increased acoustic output, reduced distortion, wider frequency range, smaller and lighter speaker housings, and lower cost.

25 Claims, 10 Drawing Sheets

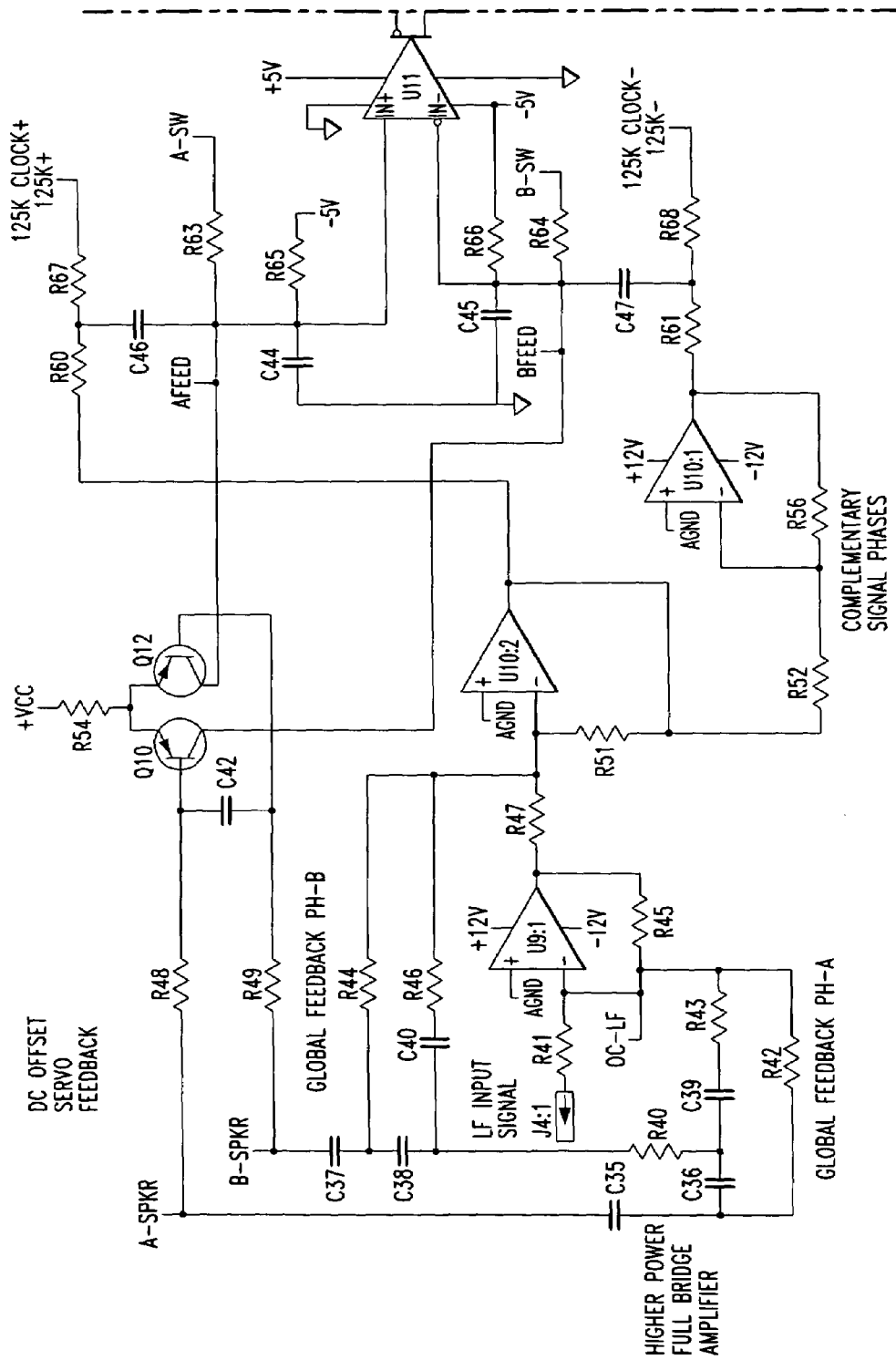

MULTI-CHANNEL, MULTI-POWER CLASS D AMPLIFIER WITH REGULATED POWER SUPPLY

CROSS-REFERENCE TO RELATED APPLICATION(S)

This application claims the benefit of U.S. Provisional Patent Application No. 60/643,733, filed on Jan. 12, 2005.

TECHNICAL FIELD

The embodiments described below relate, in general, to loudspeakers, and in particular, to application of high frequency switching technology in power supplies and amplifiers of loudspeakers.

BACKGROUND

Traditional audio power amplifiers use positive and negative power transistors, connected to positive and negative voltage rails, operating in a variable-resistance mode to pass the desired positive and negative currents to the speaker. Well-known techniques are used to minimize amplification errors. However, efficiency is inherently limited by resistive losses and is particularly low at ordinary output levels, where only a fraction of the power supply voltage is passed to the load. Efficiency can be significantly improved by using intermediate-rail voltages with steering circuitry to reduce the average voltage drop across the power transistors, but it adds complexity and introduces new sources of audio distortion. As a result, it becomes impractical to mount a very high power amplifier on or within a speaker because the heat sink will be too large and fan cooling is undesirable due to the noise and dust buildup.

A newer technique uses "high frequency switching" to replace wasteful linear power control. In this technique, transistors are used as ON-OFF switches rather than as variable resistors, and their duty cycle determines the percentage of the power supply voltage that reaches the load. Such switching can be highly efficient, since there is no current through the device when "OFF" and very low voltage across the device when "ON", thus avoiding the simultaneous dissipation of high voltages and currents that characterize the linear solution.

Known requirements include very rapid switching to reduce the time spent in the "linear" region, at a frequency well above the highest audio frequency, to permit an averaging filter to reconstruct a smooth and continuous audio waveform. Further requirements include an accurate "modulator" that converts the audio signal into a pulse width modulated (PWM) signal whose ON/OFF ratio accurately represents the instantaneous amplitude of the audio signal, followed by high-frequency power transistors with sufficient voltage and current capacity to deliver the desired power, followed by an inductor-capacitor output filter that integrates the power pulses, passes the audio-band signals, and attenuates the switching frequencies. A further requirement is a DC power supply with predictable and reasonably well-regulated voltages, to maintain the switching devices within their ratings.

The existing Class-D art suffers from:
a) Poor Linearity
b) Poor Power Supply Rejection
c) Poor Frequency Response
d) ON-OFF Noises Caused by Uncontrolled Onset of Switching Activity
e) Overload and Overheating
f) Excessive Switching Losses
g) Excessive Switching Noise
h) Excessive Complexity and Cost The causes of these deficiencies are briefly discussed: (a) Because the transfer function is not uniform over the entire range of modulation, various errors occur after the modulator which result in harmonic distortion (THD) of 1% or more, while high quality amplifiers need less than 0.1% THD. (b) In a system using standard "open-loop" PWM, the PWM ratio causes a fixed percentage of the power supply voltage to reach the load, and therefore any power supply fluctuation appears at the output. This requires either an expensive fully-regulated power supply, or results in hum and amplitude changes in the output signal. The existing "Error correcting" modulators have other disadvantages, as will be noted here. (c) Even in an otherwise perfect system, the L-C output filter has a frequency response and a Q that depend on the output load impedance. Different speakers, loadings, and other conditions make this loading highly variable, causing unpredictable high-frequency response. (d) If switching is not started and stopped in a particular manner, transients are generated, causing "pops" in the speaker. (e) Although theoretically lossless, actual Class-D schemes suffer from finite switching times and resistive losses, thereby generating a certain amount of heat. These losses can be minimized with a slight "dead time" between positive and negative switching transitions, but such dead time is another source of poor linearity. The losses also depend on the magnitude of current flow, which must therefore be limited to some safe level. Known current limiting schemes are complicated by properties of typical switching devices (FETs) whose losses increase with rising temperature. Setting protection limits that are safe at maximum temperatures may unduly limit performance at normal operating temperatures. Furthermore, external current-monitoring schemes may fail to detect excessive currents due to abnormal internal conditions. (f) Since switching losses are proportional to switching frequency, it is desirable to switch at the lowest possible frequency, but audio performance will suffer due to complications in applying overall negative feedback. Existing schemes for internal error correction cause the switching frequency to vary with depth of modulation, thereby requiring the average frequency to be increased in order to maintain the required separation between audio and switching frequencies. Existing open-loop schemes have a fixed frequency but poor linearity and no internal error correction, and therefore also require a high operating frequency to allow the use of external negative feedback. Existing Class B-D schemes require a second output inductor, and still require accurate control of timing signals to prevent long-term thermal losses. (g) A fixed-frequency scheme can use highly selective "notch filters" to attenuate switching frequencies, with minimal effect in the audio passband. Schemes with a variable switching frequency cannot advantageously use such "traps". (h) In general, these problems complexity and cost have previously been reduced by using higher switching frequencies, premium components, extremely tight tolerances, elaborate circuitry, hand-tuning of each unit, fully regulated power supply voltages, and other costly "brute-force" solutions.

DETAILED DESCRIPTION

Figure 1:
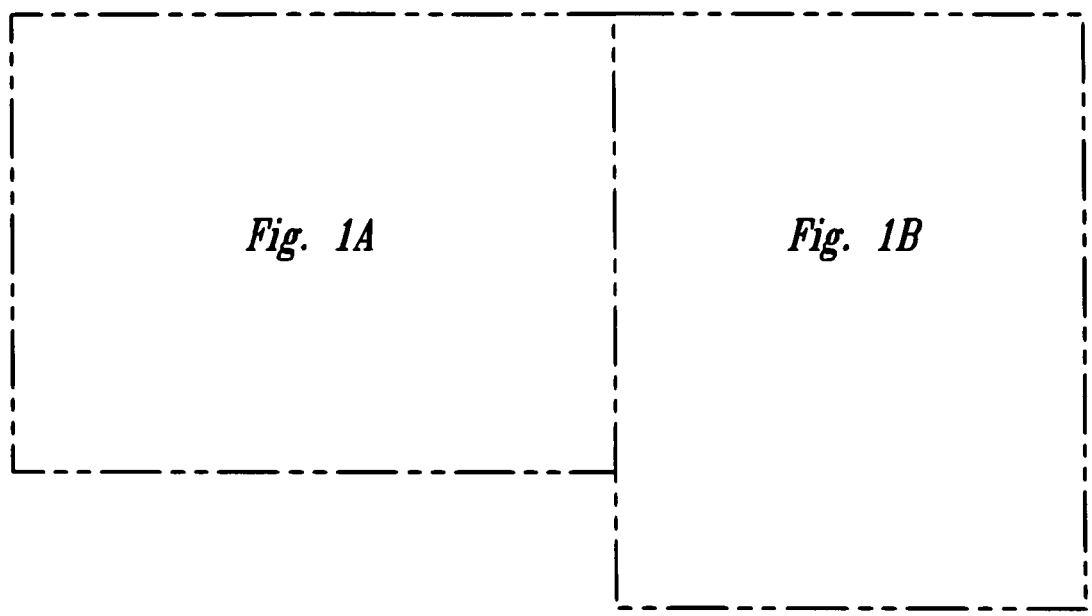
FIG. 1 shows a power supply.
Figure 1A:
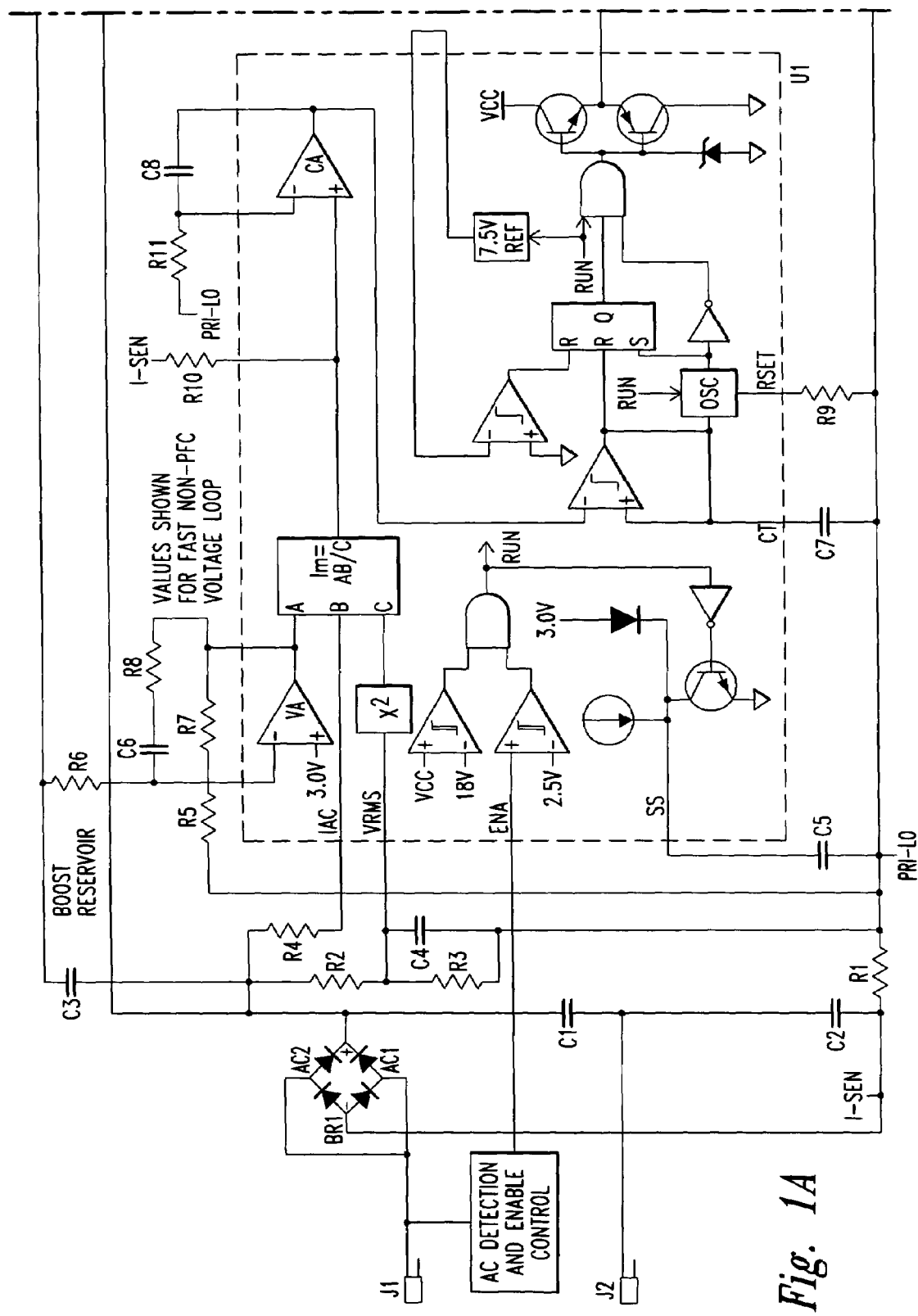
Figure 1B:
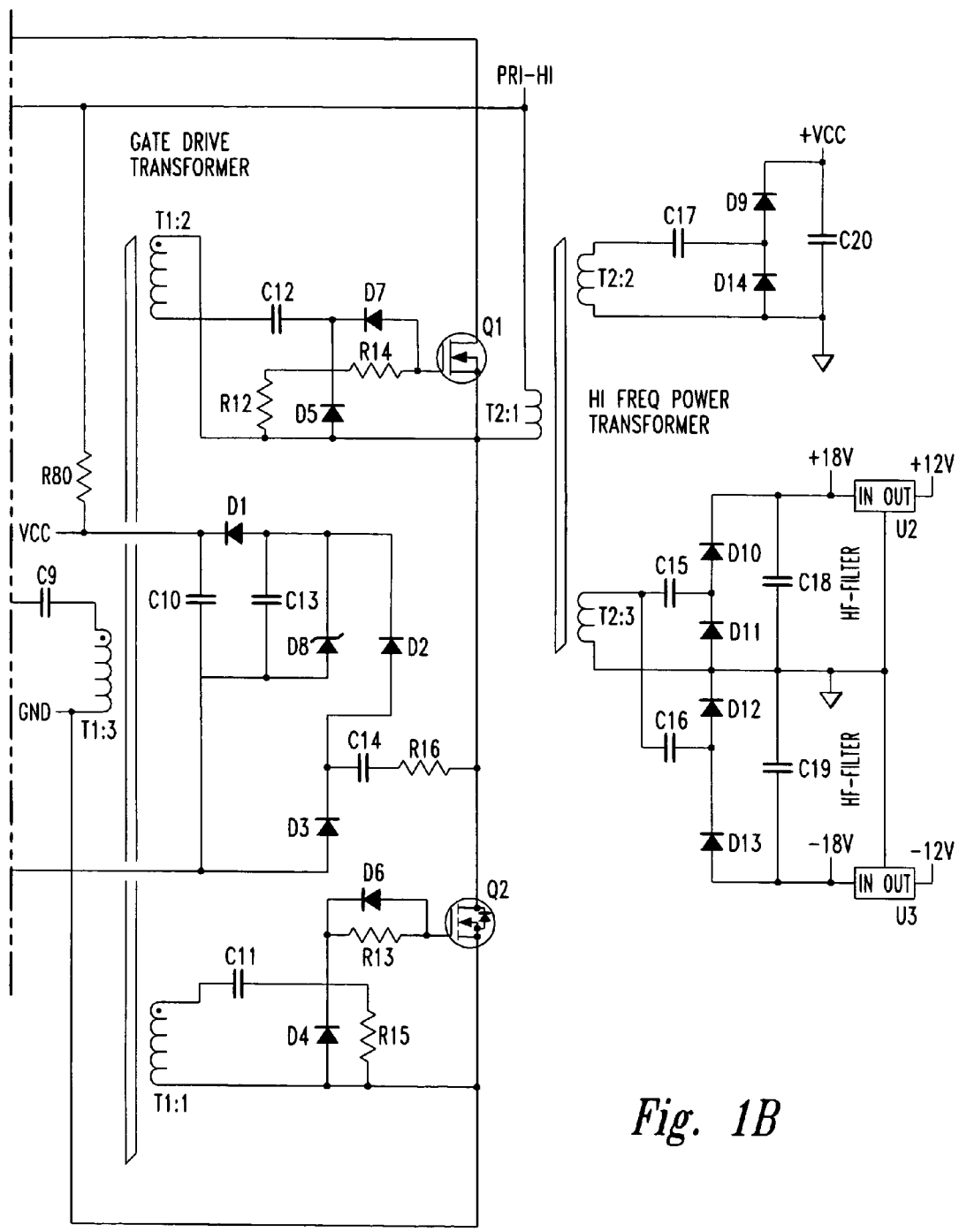

In the following Detailed Description, first a brief overview of the objectives is presented. Subsequently, a more detailed set of conditions and required elements is disclosed, and finally, using the Figures, some examples of the implementations of the disclosed solutions are presented and described.

In general, switching systems are complex, with multiple signal conversions, special signal processing, and subsystems for driving the FET gates and maintaining orderly operation. While some of these problems have been alleviated by improvements in commercially available devices, the solutions disclosed below are simple, inexpensive, and robust.

Various embodiments of the invention will now be described. The following description provides specific details for a thorough understanding and enabling description of these embodiments. One skilled in the art will understand, however, that the invention may be practiced without many of these details. Additionally, some well-known structures or functions may not be shown or described in detail, so as to avoid unnecessarily obscuring the relevant description of the various embodiments.

The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this Detailed Description section.

The description of the embodiments of the invention and their applications as set forth herein is illustrative and is not intended to limit the scope of the invention. Variations and modifications of the embodiments are possible and practical alternatives to, or equivalents of the various elements of, the embodiments disclosed herein and are known to those of ordinary skill in the art. Such variations and modifications of the disclosed embodiments may be made without departing from the scope and spirit of the invention.

Improved Linearity

Rather than removing a myriad of minor problems, a known solution for improving linearity is to apply some form of error correction such as negative feedback. Global feedback around the entire amplifier is often employed, to some effect, but the phase shift of the output filter, and the tendency to couple switching noise back into the signal path, limits the amount of feedback that can be applied. Here, the disclosed embodiments use "local" feedback within the switching section. This monitors the actual switching voltage, including all errors, couples it back to an accurate circuit that integrates these errors, and causes the duty cycle of the PWM modulator to change over several cycles in such a way as to reduce the errors.

This method improves linearity by an order of magnitude, producing high-fidelity results. It also reduces sensitivity to power supply voltages, which is one of several errors that are corrected. The switching frequency is entrained to an accurate crystal-controlled clock, thus fixing the frequency and permitting the use of output traps to reduce switching residue at the output.

Improved Power Supply Rejection

Errors due to power supply ripple are greatly reduced and a less expensive supply scheme can be used which need only maintain the supply voltage within reasonable limits, as determined by device ratings.

Improved Frequency Response

The ability to use L-C "traps" to reduce switching frequencies avoids the need for cascaded multi-pole output filters, which permits the maximum amount of global negative feedback to be used. This feedback can be tuned principally to reduce fluctuations of output voltage versus loading at high frequencies, since overall linearity has already been improved by internal error correction.

Controlling On-off Noises

Even if the input signal is muted by ordinary means, if switching is started or stopped at random, the L-C output filter experiences a step input and will consequently produce an audible output transient. However, in a standard switching amplifier using a unitized output inductor, at idle, the high frequency ripple current passes through zero in the middle of each switching cycle. If switching is started or stopped at this instant, the system "engages" or "disengages" without any residual energy in the inductor. Some embodiments of the invention therefore incorporate logic in the clock system to convert asynchronous RUN-MUTE commands to commands that are synchronized to the center of the switching cycle.

Protection from Overloads and Overheating

Current can be measured, with varying degrees of difficulty, after the output filter, but this ignores certain high frequency currents that may flow prior to the output filter. Such currents may occur, for instance, if abnormal operation drives the output filter into resonance, and it is therefore desirable to protect against this condition as well as ordinary external overloads. Furthermore, in a full-bridge topology, which is often desired for various practical reasons, there is no ground-referenced output terminal where a sense resistor can conveniently be located. Also, FET-type switching transistors have an on-resistance that increases with temperature and causes higher losses as temperature increases, leading to a potential "runaway" condition. Additionally, external current monitoring schemes suffer from the phase shift of the output filter, thereby increasing the difficulty of coupling overcurrent feedback signals back into the amplifier without oscillations.

Therefore, it is desirable to measure the current within the FET itself, prior to the output filter. A method is disclosed herein for measuring the voltage drop across the FET only during the "ON" period, and using this voltage as an overcurrent feedback signal when it exceeds a certain threshold. This avoids the phase shift of the output filter, measures all currents including internal overcurrents and, among other advantages, has the advantage of automatically reducing permissible output current as the FET heats up, thus permitting the maximum safe current to flow at any particular temperature. Since speaker voice coil impedance also rises with increasing temperature, this produces a desirable "tracking" behavior in which maximum peak current is available for sudden crescendos without risking long-term burnout for sustained overloads.

Reduced Switching Losses

The combination of several features, particularly the fixed-frequency error correcting modulator, permits the switching frequency to be reduced by 50% or more compared to prior techniques while still improving audio performance. This in itself significantly reduces switching losses.

Further improvements are made by adapting the amplifier to the characteristics of a typical high-output loudspeaker. Such speakers commonly use a high-power direct radiator for the low frequencies, and a lower power but more efficient compression driver for the upper register, with the frequency division set somewhere between 1 kHz and 2 kHz. Therefore it is advantageous to divide the overall power amplifier into two sections. One is optimized to deliver about 80% of the system power to the low-frequency driver, using a full-bridge topology, and switching at a relatively low frequency, such as 125 kHz, which supports good audio performance up to about 10 kHz. The remaining 20% of the power is delivered to the high-frequency driver using a half-bridge topology, running from the same master power supply rail, and switching at a higher frequency, such as 250 khz, sufficient to yield excellent audio performance up to 20 kHz.

The embodiments of this invention disclose specific techniques for synchronizing the two amplifier sections, operating both from a common power supply reservoir at minimum cost, coupling the half-bridge amplifier to the tweeter without ON/OFF transients, and thereby optimizing their respective efficiencies. Prior art either uses a single amplifier with a passive frequency-dividing network, which sacrifices performance and headroom, or dual amplifiers of similar construction, which fails to optimize their power for each speaker and frequency range.

Reduced Switching Noise and Stress

As noted above, by using a fixed switching frequency, selective traps may be used where speaker lines are expected to be long, or at the least, more accurately calibrated output and feedback filter frequencies can be employed. Prior schemes whose switching frequency diminishes near full modulation will emit more switching interference at full output, which interferes with orderly feedback. Such schemes are often limited to less than full modulation, sacrificing potential output power. This practice also significantly degrades efficiency at very high powers. Multi-channel systems as described above can be driven into significant clipping without objectionable intermodulation distortion, since high and low frequencies are amplified separately. Systems which are allowed to reach 100% modulation do not switch while in clipping, thus appreciably reducing switching loss at a time of high average stress.

Reducing Complexity and Cost

An overall architecture has been designed to fundamentally reduce total system costs. A full-bridge and half-bridge amplifier utilize a single common power supply reservoir, thus minimizing the power supply complexity and avoiding problems of "off-side overcharge" which occur in half-bridge amplifiers with separate positive and negative reservoirs. In some embodiments the same type of switching transistor is used for both amplifiers, and operate at a similar level of stress. The internal error-correction feedback permits the use of a less-than-perfect power supply, thus yielding certain economies as described below.

Improvements in the Power Supply

The AC-to-DC power converter is a major subsystem in any power amplifier, and it is therefore one of the objects to reduce its cost. The dual-power amplifier architecture described above operates from a single capacitive reservoir, which is a significant savings in itself. Having reduced the sensitivity of the amplifier to power supply variations, it is now possible to simplify techniques for regulation and use an innovative power supply design.

Power Supply Requirements

It is desirable for a power supply to maintain a constant voltage despite variations in AC line voltage. This stabilizes the output power, and hence the voltage stress of the amplifier sections. It is also desirable for the power supply to operate safely and efficiently for the full range of AC voltage characteristic of a region, which can fluctuate 20% above nominal and 30% below nominal.

It is further desirable to maintain adequate regulation of a low-voltage auxiliary supply, despite 0% to 100% loading of the main supply, and to fully stop the amplifier switching during "standby" or mute conditions, since it reduces losses to zero. This reduces loading on the main supply to zero, but auxiliary circuitry such as input detection or network monitoring may still be active. Overall voltage feedback is usually taken from the main secondary; but when unloaded, many conventional converters will reduce their switching activity to zero, thereby failing to support an auxiliary supply. Therefore, good cross-regulation between main and auxiliary sections is highly desirable.

A power supply comprises an additional switching converter that provides the energy used by the power amplifiers. Its efficiency is therefore equally of concern.

Simplified Magnetic Structure

Power supplies require an isolation transformer to produce secondary voltages at the desired levels, with safety isolation to meet strict regulatory requirements. Most high-power supplies also use a large inductor as part of their conversion and filtering system. It is desirable to combine these two elements for lower cost and faster manufacturing.

Primary-Side Control and Start-Up

A practical power supply must start automatically upon application of AC power. Commercially available controller chips provide a "trickle-start" capability to initiate operation, and generally obtain their sustained operating power from a special winding on the power transformer. It is desirable to eliminate this low-power winding which must necessarily be isolated from all other windings.

Primary-Side Regulation

As noted above, it is not obvious which of several secondary voltages should provide the regulation signal. Furthermore, schemes for coupling the regulating signal from secondary to primary side must meet strict isolation requirements and present a potential failure point that can result in complete loss of power supply control. Therefore, it would be preferable to regulate the voltage at a single master point on the primary side, using reliable resistive feedback to the controller chip. This provides for better AC line regulation. If the power supply has adequate cross-regulation, this voltage will be reliably transferred to all secondary windings, with only moderate and manageable amounts of "sag" that depend on individual degrees of loading.

Reduction of EMI

High frequency switching transitions can generate significant radio-frequency interference. Such "EMI" is limited by regulations. Class-D amplifiers must operate with very fast transitions to meet audio performance requirements, but since they operate from an isolated secondary-side supply, by using good practices, the high frequency currents can be contained and re-circulated without excessive emissions. However, the primary-side power supply switches are necessarily somewhat coupled to the AC line, and their switching interference can be difficult to contain. An ideal supply would thereby operate with relatively gradual switching transitions, and be arranged so the resulting currents self-cancel as much as possible.

Brief Description of the "ERAC" Power Supply

The above mentioned objectives can be met by an Envelope-Rectified, Active-Clamp power supply scheme as described below.

Overall Objectives

The combination of the above objectives are met by arranging for the following conditions:

1. The switching waveform should be a flat-topped rectangular waveform, whose peak-to-peak value is maintained at a regulated level by control circuitry. This is because a flat-topped waveform does not require series inductance for efficient rectification.
2. This voltage waveform is passed through a high frequency isolation transformer, with one or more secondary windings having turn-ratios as desired, whose outputs are peak-to-peak rectified by high frequency diodes, thus maintaining a predictable voltage on one or more secondary capacitor reservoirs. This waveform need not have any particular high-low duty cycle since only the peak-to-peak voltage is material. As each secondary independently rectifies its own square-wave voltage, substantially undisturbed by loading on other secondaries, this system produces good cross-regulation.
3. In practice, the high-low ratio should remain between, for example, about 20% and 80%, as narrower pulses require excessive peak currents to transfer a given amount of energy.
4. Speed of transitions can be reduced without incurring switching loss, thus reducing the generation of high frequency harmonics and EMI. This is possible because the current only flows while the waveform is at its peak voltage, and not during up-down transitions.

Implementation of the Objectives

The above conditions are satisfied with a combination of the following elements:

1. A high frequency isolation transformer, using ordinarily suitable materials, such as a ferrite core with copper foil windings.
2. Providing the transformer core with an air gap, so that it can sustain substantial DC current in the primary without saturating, and which is set to yield a predictable value of shunt inductance.
3. Reducing series inductance by ordinary means, but a reasonable residue of "leakage inductance" may be accommodated without ill effect.
4. Coupling one end of the transformer primary to the off-line DC reservoir (e.g., 200-400 Vdc).
5. Configuring a first switching transistor to couple the other primary end to the low end of said reservoir, causing current to ramp up in the primary inductance of the transformer.
6. Turning off the first switching transistor after a certain interval, wherein the normal action of a charged inductor causes the voltage to fly up to a level higher than the offline reservoir. This action resembles the well-known boost converter.
7. Clamping this voltage to a second reservoir, establishing a "boost voltage" which can be maintained at a set voltage, for example 520V, by varying the on/off ratio of the first switching transistor.
8. Obtaining the desired rectangular on-off waveform constrained between the low side of the primary reservoir and the boost voltage reservoir, as the switching activity continues, thus producing a predictable peak-to-peak voltage (e.g., 520V).
9. Rectifying this voltage waveform, which is coupled through the windings of the transformer, on the secondary side; maintaining predictable voltages on one or more isolated secondary capacitors. It is important to note that the duty cycle of this waveform may be varied, within limits, by the primary-side controller, as required to maintain the specified voltage (e.g., 520V) on the boost reservoir against variations of the AC voltage, without affecting the rectified voltage on the secondary side.
10. Replacing the diode clamp with a second switching transistor that is controlled in alternation with the first switching transistor. This is because due to the leakage inductance, there is a small amount of uncoupled energy in all practical transformers that does not flow through to the load, which must be clamped to the boost reservoir to avoid a destructive voltage spike. However, a simple diode clamp to the boost reservoir only couples energy into the reservoir, and therefore, its voltage will be driven higher without limit unless some means is added to discharge it. This problem is solved, without wasteful bleeder schemes, by replacing the diode clamp with a second switching transistor, which is controlled in alternation with the first switching transistor. This technique is called an "active clamp".
11. The active clamp comprises a second high frequency switching FET of normal construction, although its size may be considerably smaller than the first switch. When the first switch is turned off, the primary voltage flies up to the boost reservoir, whereupon clamping current flows backwards through the intrinsic diode of the second switch into the boost reservoir. After a short, non-critical period, the second switch receives its on-signal and assumes a bi-directional low-resistance state. The boost reservoir voltage climbs as the leakage energy is discharged into it. At some point, its voltage exceeds the voltage reflected back from the secondary, as clamped by its rectifiers into the secondary reservoirs. Since the active clamp switch is now turned on, the excess energy on the boost reservoir then flows forwards through the switch and through the transformer, thus adding to the energy reaching the load, and discharging the boost reservoir until it matches the reflected output voltage. Hence, the voltage of the boost reservoir is made to track the output voltage, and therefore, it may be used as a primary-side reference voltage for the regulator control system. At the end of the duration determined by the controller system, the second switch turns off. With a proper arrangement of element values and durations, as explained below, the current in the primary shunt inductor will have reversed, and therefore the primary voltage is carried back to zero without dissipation, whereupon the first switch is turned on to begin the next cycle.
12. Placing a moderate amount of shunt capacitance across the transformer primary, such that the inductive current stored at the end of each switching period is sufficient to produce a transition to the opposite rail with a predictable, moderate dv/dt in the capacitor, thus obtaining relatively gradual switching transitions without dissipative currents in the switching transistors. It can further be arranged that the current through this capacitor is rectified and used to power the controller circuitry, with system benefits that are described in more detail below. A further advantage of this system is therefore the opportunity to obtain zero-voltage, lossless switching, with well-controlled rise and fall times to reduce EMI.

13. It may be helpful to view this system as a boost converter superimposed on a voltage-to-voltage converter. The voltage on the boost reservoir is maintained by a commercial controller IC designed for this purpose, and the normal boost-converter control function applies. At the same time, the boost reservoir is loaded by coupling through the transformer into secondary-side reservoirs; because the switching voltage is rectangular and only minimal series inductance is present, the boost reservoir voltage is coupled tightly to the secondary reservoir voltages and they all track together. As noted, it is advantageous if the off-line voltage and boost voltage remain within a desired ratio, for example 4:1 ratio, so that the high-low ratio of the switching waveform remains within these limits, and peak currents remain reasonable. This is the reason for choosing a boost voltage such as 520V, with respect to the 200-400V range of the off-line capacitors. A further advantage of this choice is that such on/off ratios can be coupled with a simple gate drive transformer connected to a low-cost "single ended" controller IC, thus driving the second switch at minimal cost.

In summary, the disclosed scheme comprises "envelope rectification", in which a peak-to-peak voltage maintains a predictable voltage on one or more isolated DC reservoirs without using significant series inductance, and employs "active clamping" to produce the constantly-running, primary switching waveform with a regulated peak-to-peak voltage and a reasonably constrained high-low duty cycle.

Description of FIG. 1

FIG. 1 is a schematic diagram of a regulated power supply in accordance with an embodiment of this invention. The AC line voltage is connected to J1-J2. For operation at 80-140 Vac, the voltage doubler connection as shown is used. For operation at 160-280 Vac, J2 and BR-1 should be rewired as a full-bridge rectifier. This yields the same range of approximately 200-400 Vdc of unregulated DC voltage between the ends of the reservoir formed by C1 and C2.

The AC Detection and Enable Control block uses any convenient technique to detect the presence of AC voltage and activate the Enable pin of the controller IC, for orderly start-up and shutdown.

R1, R2, R3, R4, C4, C5, C7, R9, R10, R11, and C8 are employed in accordance with the instructions from the manufacturer of the controller IC, UC3854A, and is set up to oscillate at a convenient frequency, such as 90 kHz, with gradual start-up, and responsive to signals representing incoming AC voltage and current flows in the power circuit. This enables the controller to perform its main function of regulating the voltage delivered to the Boost Reservoir, C3.

Different controller IC's or control systems may be substituted by those of ordinary skill in the art, although it is most convenient to use controllers designed for boost conversion. It should also be apparent that the particular controller used in this disclosure is also designed for use as an active Power Factor Controller, and the ERAC scheme can be operated, like any ordinary boost converter, so as to draw current from the line substantially in proportion to the instantaneous voltage, over most of the AC cycle, thus fulfilling the fundamental requirements of a high power factor converter system. The normal trade-offs of such schemes still obtain; wide variation of the current through the ERAC system over the AC cycle, increasing AC ripple on the output, and diminishing the average power delivered to the load. Furthermore, such schemes require full-wave AC rectification with only a small, high-frequency DC filter, thereby precluding the use of the voltage doubler scheme shown for 120V operation. For these reasons, although not shown here, using the ERAC system for high-power-factor conversion is within the scope of this invention.

The output of the controller IC is a variable pulse-width signal, almost equal to its supply voltage, which is applied via C9, to gate driver transformer T1. The secondary windings of T1 are applied, in opposing polarity, to the gates of switching transistors Q1 and Q2. Since the operation of the controller IC causes the PWM signal to vary between about 20% and 80% duty cycle, and since it is necessary to AC-couple the signal through the gate drive transformer to prevent saturation, the signals are restored to a defined range of about −0.6 to +10V by the DC restoration circuits comprising C11, D4, and R15, and C12, D5, and R12. R13 and R14, in combination with D6 and D7, create an adjustable "dead time" between turn-off and turn-on of the complementary switches. The net result is that Q1 and Q2 are driven in alternation, at the on-off ratio determined by the controller IC, with a moderate dead time between off and on, during which the switched voltage can make a smooth transition as explained below.

Q2 is the "first transistor" whose on-time determines the current stored in the shunt inductance of isolation transformer T2. Q1 is the "second transistor" which couples the flyback energy to the boost reservoir C3. In accordance with the normal operation of such schemes, the magnitude of voltage boost applied to C3, relative to the source voltage, is a function of the on/off ratio of Q2. The voltage on C3 is fed back via R6, with compensation elements applied in accordance with manufacturer's instructions, to form a closed-loop system which varies the duty cycle of Q2 as required to maintain a set voltage on C3. The resistor ratios of R6, R5, and R7 are adjusted with respect to the internal voltage reference of the IC to produce a voltage at least 20% above the highest input voltage, but safely below the device ratings, in this case, about 520V on C3 when the system is in equilibrium.

The secondary rectifier structure uses the same "DC restoration" technique described for the gate drivers, except at much higher power. During the "down stroke", when Q2 is turned on, the voltage into C17 goes low, pulling its other terminal 0.6V below ground, engaging D14 and placing a certain charge on the capacitor. During the "up stroke", C17 moves up by a voltage determined by the peak-to-peak primary voltage, and the transformer turns ratio, charging secondary reservoir C20 via D9. It will be appreciated therefore, that C20 receives a voltage always equivalent to the peak-to-peak voltage swing, less two diode drops, and this voltage swing is a reflection of the voltage maintained on boost reservoir C3, regardless of reasonable variations in the switching waveform duty cycle caused by the controller IC while maintaining this intended voltage.

The value of C17 is not critical, but should be adjusted so that its voltage does not change excessively during a single switching cycle of the longest duration. If C17 is too small, its voltage will change enough during a single cycle so as to terminate the flow of current. This effect can be exploited in limited cases, but does not co-ordinate well with the wide swing of duty cycle characteristic of this scheme. D9 and D14 are selected for adequate current handling and very rapid recovery time. A full-wave diode rectification scheme can be substituted without essentially changing the action of C17 and the effects of peak rectification.

An auxiliary power supply is illustrated, comprising a second winding, with positive supply comprising C15, D11, D10, and C18, and negative supply comprising C16, D12, D13, and C19. As described above, the peak-to-peak voltage of this winding is transferred to each filter capacitor, less two diode drops. C15 and C16 are adjusted to pass varying amounts of current, thereby performing a useful current-limiting function to prevent destruction of the low-power diodes due to local overloads. As shown, the positive supply will support at least 0.6 A, whereas the negative supply is limited to about 0.2 A. Linear post regulators are applied in a known manner; their losses are materially reduced by the approximate regulation of the voltage supplied to them.

All supplies have a no-load voltage that accurately reflect the regulated primary voltage. As load is applied, a moderate amount of sag occurs due to minor voltage drops in the diodes, transformer windings, etc. This is not detrimental to a properly designed power amplifier, and can be allowed for in the headroom of the linear regulators. It is, however, a notable benefit that the system provides regulation against AC voltage fluctuations, thus allowing all components to be designed for a definite range of voltages.

C14 and R16 form a combination snubber (RFI absorber) and dv/dt control element. By correctly sizing the gap in the power transformer, thereby controlling the value of shunt inductance, it can be arranged so that the current in the transformer primary is flowing out of each switch at the time of turn-off. This occurs in the normal course of events when turning off Q2, since turning it on causes inductor current to ramp up. It is not so obvious that this current can be reversed by the time Q1 is turned off, but this is possible by correct choice of values for C3, C17, and the transformer primary inductance. These values should be adjusted so that C3 initially charges, at the beginning of the "off" period of Q2, followed by a period of discharge (through Q1 and the transformer into the load, and into the transformer inductance) that continues to the end of the longest switching period (80%).

This establishes a current flow in the transformer primary in the correct polarity to cause a voltage transition to the opposing rail. Having obtained reversing currents in the transformer inductance that are in the correct polarity to cause up and down voltages, it will be appreciated that placing a definite capacitance across the transformer input will result in a defined dv/dt, hence reducing high-frequency harmonics that generate EMI, without dissipating any energy in the switching devices. It should also be noted that the long-term voltage on C3, over many switching cycles, automatically adjusts itself to maintain equilibrium between charge and discharge, thus making C3 a usable point to measure overall voltage, for regulator control.

The addition of C14 and R16, while not necessary for the ERAC scheme, provides strong benefits in reducing EMI. A further benefit can be obtained by arranging a rectifier circuit for the current flowing through C14. This circuit comprises D3, D4, reservoir C13 and shunt regulator D8. C14 can be sized to deliver current to power the controller circuitry, without the additional expense of a special power transformer winding. Since the rectifier scheme only affects about 15V out of a travel of 520V, there is very little effect on the snubber's ability to control dv/dt.

In accordance with manufacturer's instructions, a "trickle-start" resistor R80 ramps up voltage on supply capacitor C10, until the controller IC exceeds an internal threshold and begins operation. This causes an increased operating current that would quickly deplete C10, if not rapidly supplemented by an external power source. By making C10 substantially larger than C13, it is insured that C13 is charged by the onset of switching activity before C10 falls to the turn-off threshold of the controller, thereby supplying stable operating current via D1. It will be appreciated that this scheme maintains a desirable balance of energy flow without excessive losses.

The operating current of the controller scheme is largely determined by the energy required to charge and discharge the transistor gates. This "gate charge" is mostly determined by the device parameters and operating voltage of the switches. This same operating voltage is the primary determinant of the current returned through C14 and ultimately D1. Therefore, the scheme automatically provides the appropriate amount of controller circuit energy over a wide operating voltage. A further advantage occurs if there is any condition, such as a load fault, that prevents the switching voltage from reaching its normal value. If the switching voltage does not appear as expected at C14, there is insufficient energy to maintain controller operation, and the system shuts down when C10 reaches the controller's undervoltage lockout value.

Figure 2:
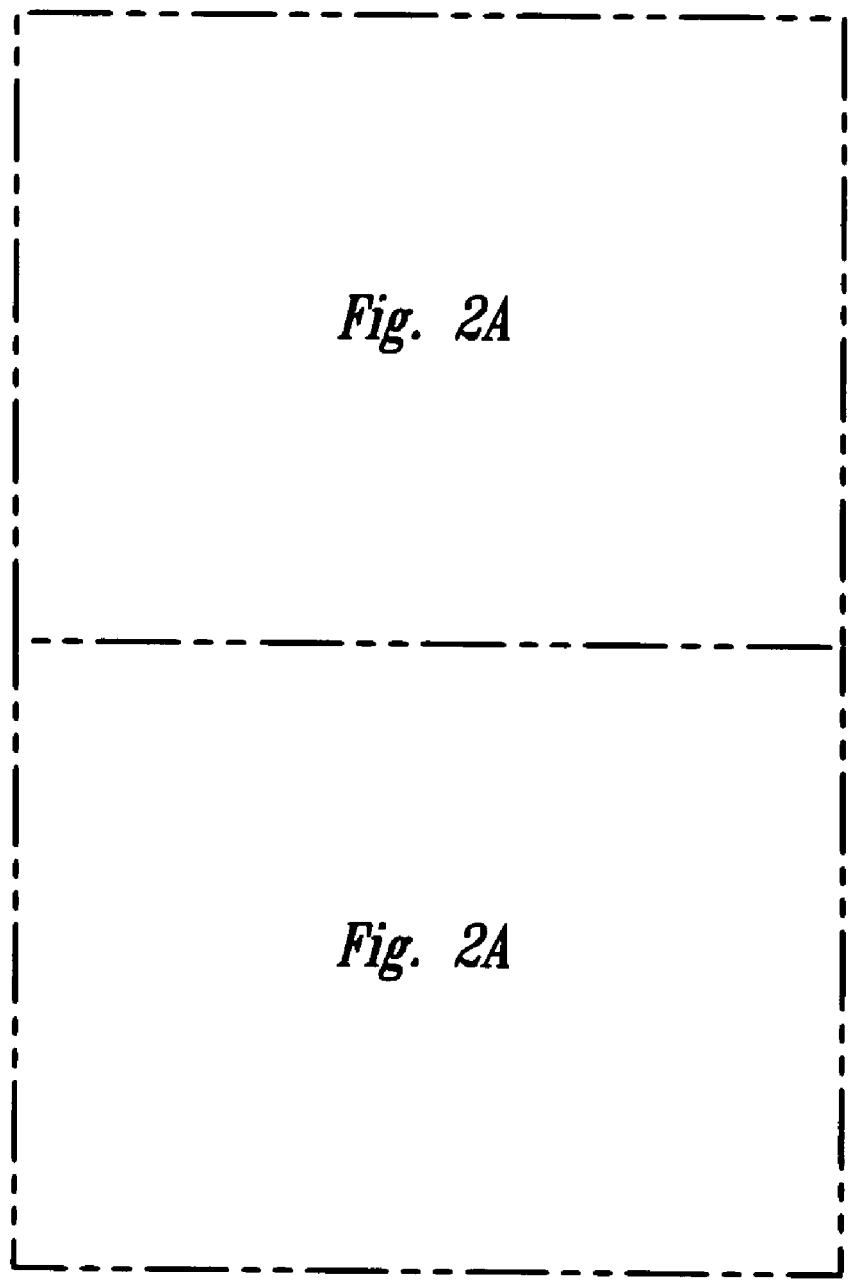
FIG. 2 shows a clock circuit and a half-bridge amplifier.
Figure 2A:
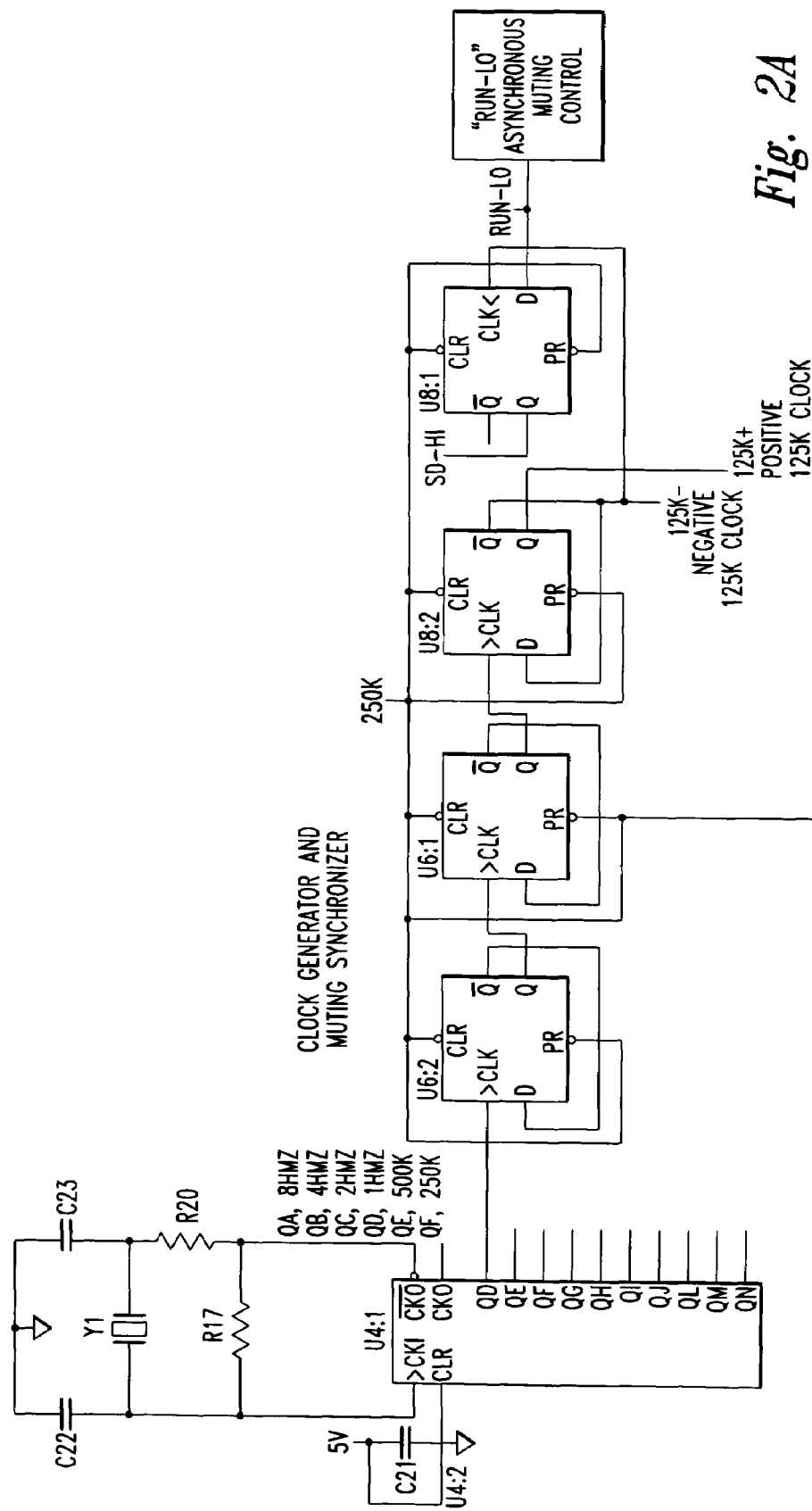
Figure 2B:
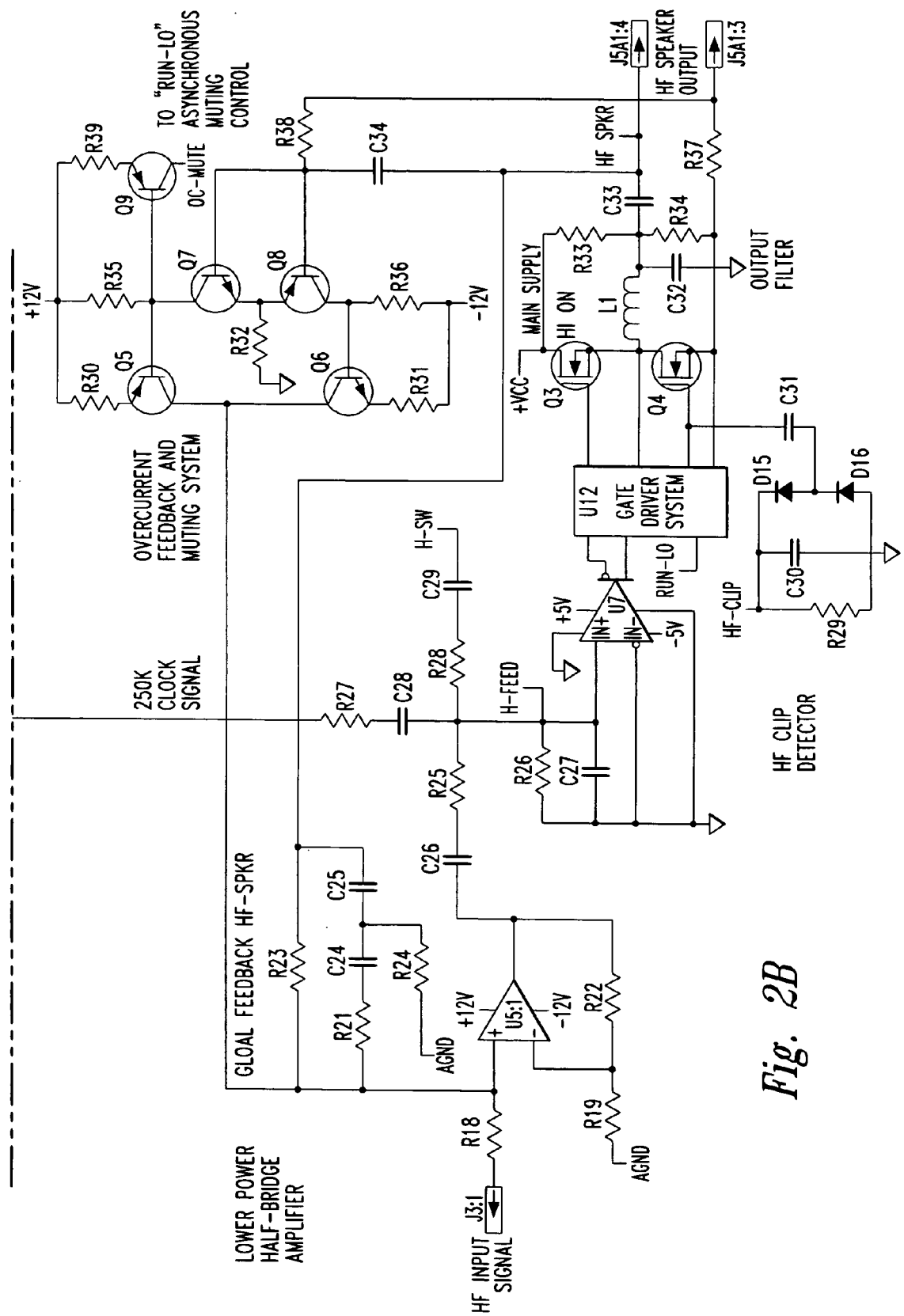

Description of FIG. 2

Having disclosed a power supply with good load and AC-line regulations, an audio amplification circuitry is described starting with FIG. 2, which illustrates a system clock and a half-bridge output channel.

The basic switching circuitry shown in FIG. 2 uses known Class-D techniques. A commercially available gate driver block U12, drives switching transistors Q3 and Q4, which are selected for adequate voltage, current, and speed. These transistors switch between ground and +Vcc, set in this case at +125V. This switched waveform, whose duty cycle is varied by the modulator, passes through L1, which integrates the pulses, and C32, which further filters the switching frequency, resulting in an audio-frequency waveform for connection to a loudspeaker, in this case capable of 200 watts into 8 ohms.

It will be apparent, however, that there is an average DC voltage of about half the supply voltage at the output of the half-bridge, blocked by C33, which should be sized to pass the frequency range of interest for the high-frequency driver. However, a system using these known techniques will experience an unacceptably large turn-on transient, as the average DC voltage will appear abruptly at the onset of switching, creating a large pop in the driver while C33 charges.

One known solution is a balanced bipolar supply, but it was desired to operate all channels from a common single reservoir. Commercial gate drivers are designed to accept signals referenced to the lower rail, thus the most convenient reservoir has the lower end referenced to ground. Therefore, a resistive divider R33, R34 is added to slowly bring the voltage up to the operating point, without an appreciable transient, during which time the amplifier is held in muting by a system described below. After a suitable delay, for example 1.5 seconds, switching may begin without an appreciable disturbance, subject to one further condition discussed under the clocking scheme.

Global feedback is taken via R23 from the ground-referenced end of C33 to avoid any DC offset. It is highly desirable to include the output filter within this feedback loop, as this provides a means to regulate its output voltage despite changes in loading. However, the phase shift of the 2-pole output filter causes known problems in attempting to enclose it within a feedback network with high loop gain. Therefore, a 2-pole compensating phase lead network, comprising C25, C24, R21 and R24, is added to R23, enabling considerably more feedback to be applied relative to a single-pole network. The values of C25, C24, and R24 set the frequency of the 2-pole lead network, which is adjusted to offset as much of the phase shift of the output filter as possible. R21 is added to reduce the amount of residual switching noise fed back into the input, without greatly reducing the effect of the compensation network at frequencies where the filter phase shift is most troublesome. The loop gain of the overall feedback system can be adjusted by controlling the gain of the linear op-amp block, for instance by setting R22.

A known scheme for converting the audio input into a PWM pulse train uses a comparator to detect the instants where the audio signal crosses a triangle-wave reference, thus generating a PWM signal whose duty cycle varies with the amplitude of the audio signal. Such signals are then connected to the gate-driver and switching system described above. Using this "open loop" scheme, even with global feedback as described above, will generally result in amplifiers with 0.2% to 1% THD readings; not sufficient for high quality applications. Errors after the modulator, such as minor timing shifts in the gate driver, variations in the supply voltage, and differing resistances in the switching transistors, all perturb the actual output signal and thus degrade performance, unless individually attended to with costly and difficult-to-manufacture detail improvements.

Figure 3:
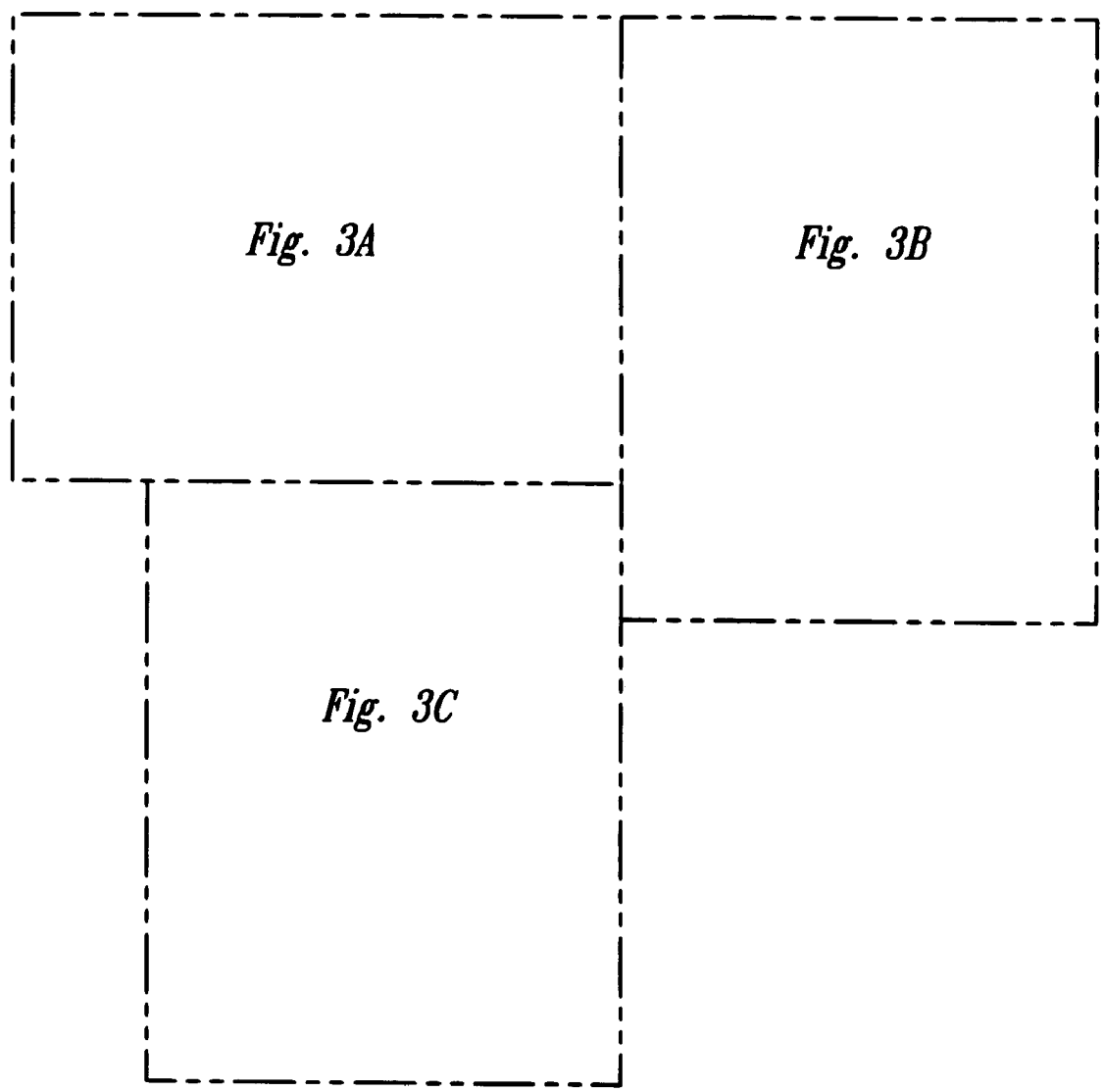
FIG. 3 shows a full-bridge amplifier.
Figure 3B:
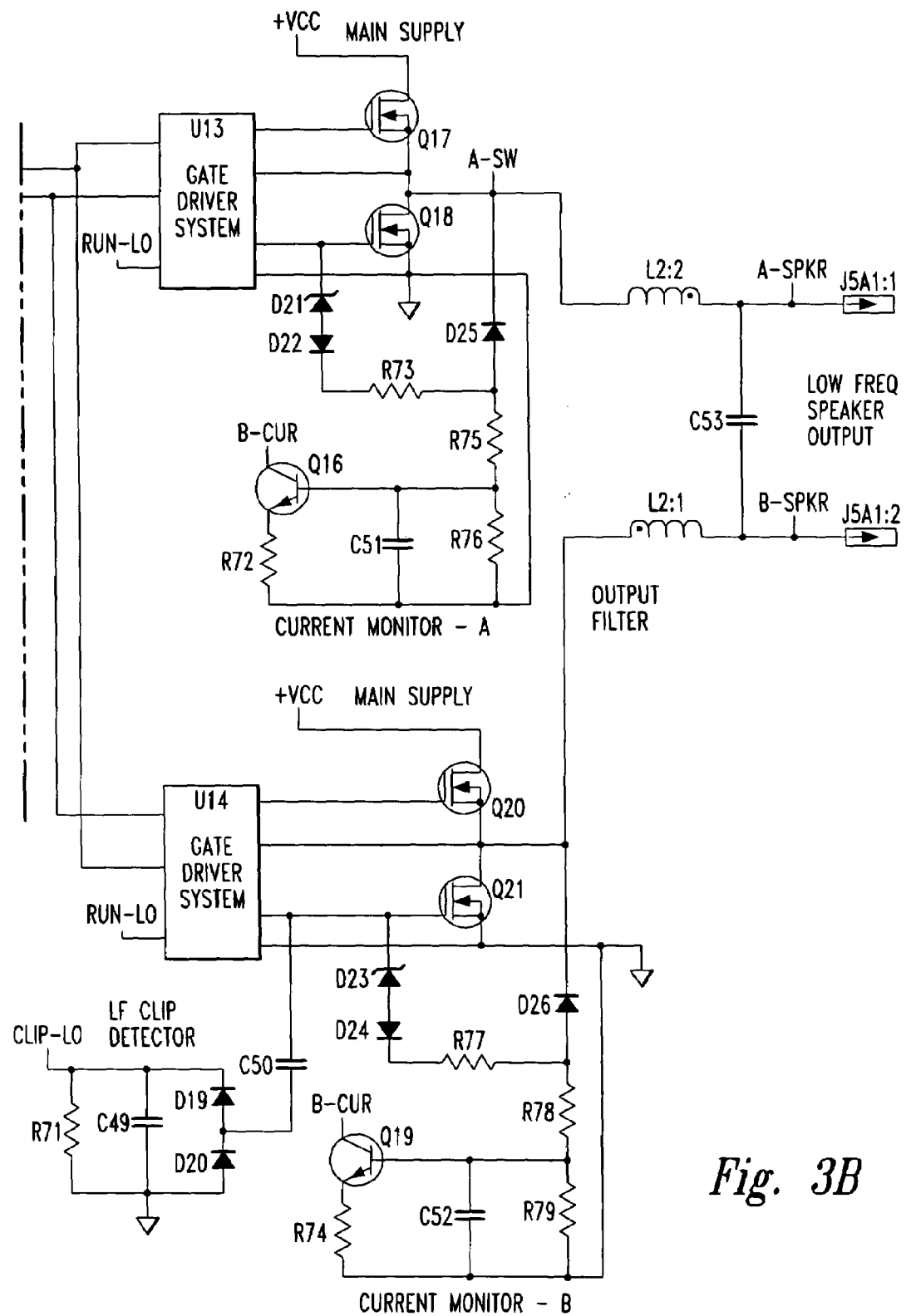
Figure 3C:
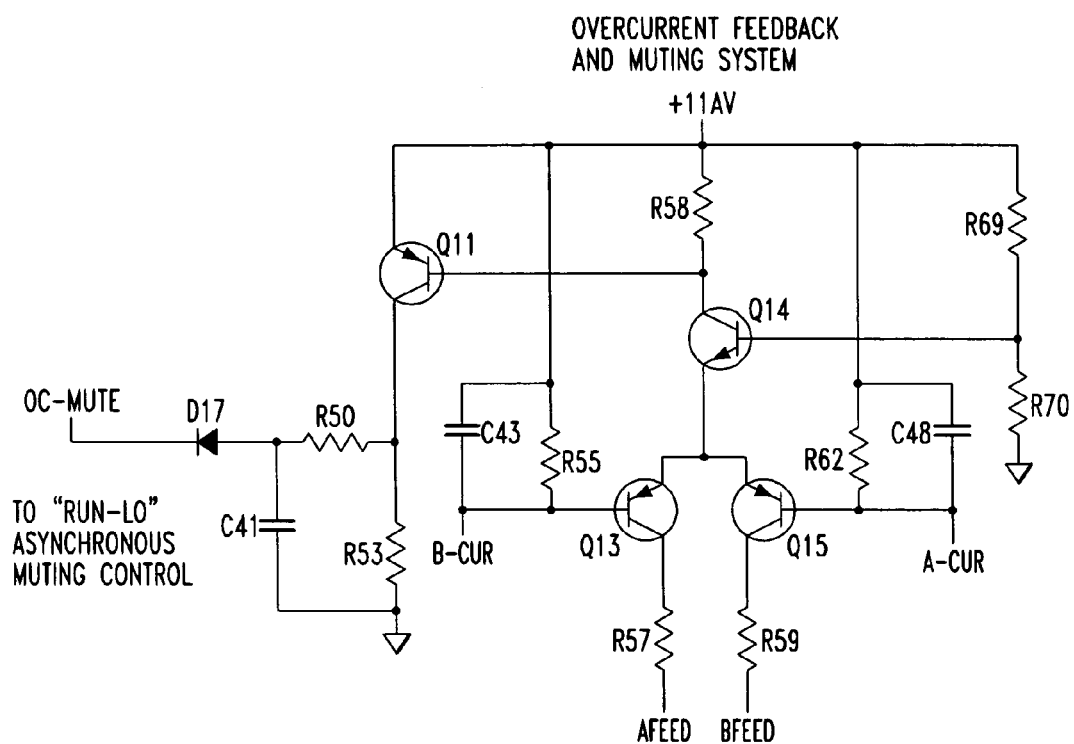

In yet another embodiment of the invention, shown in FIG. 3, an additional local feedback scheme is applied advantageously to both this amplifier topology and the full-bridge topology.

The modulator system begins with a square-wave signal from the clock logic, applied via R27 to C27, whose value is adjusted to integrate the square wave clock signal into a triangle wave. It will be appreciated that a simple capacitor, carefully located within the circuitry, is immune to most sources of interference that upset the purity of other more elaborate triangle wave generators. The audio signal is introduced via R25, whose value is set high with respect to the clock input, so as not to upset the quality of the triangle wave. A high speed comparator, U7, detects the instants at which this mixture of audio and clock signal crosses back and forth across ground, and delivers complementary high-low gate drive signals to the two input ports of the gate driver block.

This system is equivalent to the above-mentioned "open loop" audio-to-triangle wave comparator, and if left in this state, would yield similar results. A published improvement suggests the addition of R28, coupled to the switched output signal, just prior to the L-C output filter. If the comparator is connected in correct polarity, this introduces negative feedback from the switched output to the integrator formed by C27. In accordance with this suggestion, R27 and R28 must have a ratio such that the current from the clock signal is larger than the current from the feedback; this ensures that the switching frequency remains entrained to the clock. In this manner, all errors except those of the output filter itself, can be returned locally to the modulator and thereby cause the PWM signal to vary, continuously from cycle to cycle, in such a way as to minimize such errors.

Using this technique produces at least an order of magnitude improvement in overall linearity, yielding 0.01% to 0.05% THD over most of the operating range, without hand-trimmed adjustments.

To use this technique in the half-bridge amplifier shown here, C28 is added to decouple the average DC voltage of the clock signal, C29 is added to decouple the DC content of the output feedback, C26 decouples any DC offset from the audio input section, and R26 is placed around C27 to maintain the average voltage at ground. Thus, the DC voltage of the comparator input stands at zero, and the PWM signal averages 50% on/off at idle, with excursions from 0 to 100% as driven by the audio input signal. The 50% idle condition accurately centers the switched waveform between ground and +Vcc, thus ensuring symmetrical peak output voltages regardless of exact Vcc voltage.

It is frequently desired to detect clipping and alert the user that the system has exceeded its rated power. C31 is connected to the lower gate-drive signal, and during normal switching, feeds a small current via D16 and D15 to maintain a charge on C30. When modulation reaches 0 or 100%, the system clips, switching stops, and R29 is set to deplete C30 within several switching cycles. This abrupt change can be detected by any convenient method and used to turn on a signal lamp or monitor flag. It will be appreciated that this technique is only usable with amplifiers that are allowed to reach full modulation.

Since this is a half-bridge amplifier, with a ground-referenced output, current-sense resistor R37 can be placed in series with the return from the speaker. Its value is adjusted to produce about 0.6 volts at the intended peak current. Q7, Q8, and R32 form a bi-directional threshold at this voltage, delivering "overcurrent" signals via Q6 and Q5 to the global feedback node. This additional feedback opposes any further increase in current, thus preventing excessive stress. However, prolonged operation at this current, as might occur into a shorted driver, can still overheat various power-handling elements, and therefore Q9 is arranged to deliver an overcurrent flag to the Muting Control block that delivers a muting signal after a pre-determined interval.

This type of overcurrent protection is effective, but suffers from certain minor defects. There is a tendency for minor oscillations during current limiting, and the current limit is not responsive to the temperature of the switching devices, but these limitations are acceptable given the moderate power target of this section, and the fact that current limiting should never be reached when connected to a normal load.

Commercially available gate-driver IC's provide an Enable Input that can be used to turn switching on and off (or logic may be arranged to perform the same function on the PWM signal). This permits the amplifier to be placed in Standby or Mute with zero dissipation, a valuable response for on-off muting, overheating, or remote-control of amplifier operation. However, this input cannot be triggered at random without risk of generating transients in the output filter. It is a further object of this invention to illustrate how switching may start and stop without appreciable transients.

It is known that fixed-frequency Class-D systems require a clean and stable clock signal for low system noise, and therefore commercially available components U4, R17, Y1, C22, and C23 are used to form a crystal-controlled oscillator, whose frequency is subdivided by standard logic blocks. A first use of the final stages of this divider chain is to provide synchronous 250 kHz clock signals for the half-bridge amplifier shown here, and bi-phase 125 kHz clock signals for the full-bridge amplifier of FIG. 3. Unsynchronized clock frequencies are liable to create beat frequencies within the audio band that are audible even at very low levels.

Noting that the clock signals are supplied to their respective modulators as soon as the power supply starts, and noting that the gate-driver Enable pin holds all switching transistors "off" when disabled, effectively disconnecting the output inductor, it remains to determine the right moment to initiate transient-free on/off operation. Note that the output inductor current reaches positive and negative peaks at the moments of positive and negative switching, and therefore passes through zero halfway through each switching cycle. Since an inductor can only be disconnected without disturbance at zero current, this is therefore the time to start or stop the switching.

This can be effected by arranging a D-type flip-flop, U8:1, so as to accept the asynchronous Mute signal from the Muting Control block, and synchronize it to one output of the 125 kHz divider chain, from U8:2. Since the 125 kHz transition occurs synchronously with the 250 kHz pulse, this effectively causes the Enable pin to toggle only on selected edges of the 250 khz clock. And since the 250 kHz clock pulse is fed to integrator C27, and drives it high and low about zero, its voltage crosses zero halfway between these edges, causing output switch transitions to occur halfway through each clock pulse. Therefore, by synchronizing the Enable pin to any clock edge, Enable action occurs halfway between output transitions, exactly as desired. By using the 125 kHz clock, the same benefit applies to the full-bridge amplifier of FIG. 3. Note that this scheme only applies to externally clocked Class-D systems where a clock signal is available.

Description of FIG. 3

FIG. 3 depicts a full-bridge output channel in accordance with an alternative embodiment of the invention. It is known that a full bridge topology automatically delivers twice the voltage swing, and hence four times the power to a given load impedance, and this fact is used advantageously to deliver the desired, e.g., 80%, of system power to the low-frequency driver, using a common power supply. In this example, for instance, 800 W is available to an 8-ohm load. Special techniques have been described above to couple the half-bridge driver to its load without deleterious side effects. The full bridge amplifier can, in principle, be connected directly to its load without need for DC-blocking capacitors. However, both ends of the load are "driven" and therefore there is no convenient place to put current sensing resistors, and both ends carry an average DC voltage of half the power supply. These problems must be overcome when coupling to the rest of the system.

The power circuitry uses known techniques. Two gate driver blocks U13, U14, control half-bridges Q17, Q18 and Q20, Q21, in a similar manner as in FIG. 2, with the same signals in opposite polarity so that one is high when the other is low. Current flows from the supply, through one half-bridge, though the load, through the other half-bridge, and to ground. Each section has an output inductor, which may conveniently be half of a coupled inductor L2 if the timing signals are sufficiently accurate, bridged by a capacitor C53, behaving overall as described in FIG. 2.

The load is connected in parallel with C52, between the two outputs. Since this section is intended for operation only up to several kHz, it can conveniently use a lower switching frequency, such as 125 kHz, and the output filter is adjusted to a correspondingly lower frequency. The reduced switching loss offsets the higher conduction losses caused by the increased output currents delivered to the load.

By noting that same signals occur in both half-bridges, we need only connect a single Clip Detector, C50, D19, D20, C49, and R71, operating as described in FIG. 2, and scaled for half the frequency.

Since the full-bridge system is a balanced differential scheme, it is necessary to provide balanced feedback systems for both global and local feedback. These modifications are described below.

Global feedback is taken via R42 and R44, to feedback nodes of opposite polarity, around U9:1, and are connected to the appropriate half-bridges to produce negative feedback. C36, C39, R43, and C38, C40, R48, and R40 form a balanced differential 2-pole compensation network as described in FIG. 2. The feedback network should be as symmetrical as possible, but DC blocking capacitors C35, C37 prevent minor resistance tolerance errors from creating DC offsets. U10:2 and U10:1 create matching differential audio signals to feed the modulator.

A significant operating mode of the error-correcting modulator has been described in connection with FIG. 2. However, to adopt this scheme to a full-bridge amplifier, it is necessary to feed back errors from both sections in a symmetrical manner, and therefore, all circuitry is duplicated with opposing signal polarities. Matching integrators, C44, C45 receive opposite polarity 125 kHz clock signals from U8:2 (FIG. 2) via R67, R68. Each integrator receives its respective polarity of audio signal via R60, R61. These currents are coupled to the integrators via DC-blocking capacitors C46, C47. Each comparator receives local feedback via R63, R64, which couples audio and DC feedback from each half-bridge.

These feedback signals are shunted to the same negative voltage by R65, R66. By using precision resistors, the DC offset of the two half-bridges is thereby maintained at a reasonably low value, and is not perturbed by offsets on the other sides of C46, C47. A fast comparator U11 delivers complementary drive signals to the gate driver blocks, with the requisite polarity reversal between the two blocks. A DC servo block, comprising Q10, Q12, R54, R48, R49 and C42, detects any remaining DC offset across the load and returns a DC-correction term without otherwise affecting the audio-band feedback.

As noted previously, there is no convenient place to connect a current-sensing resistor and is therefore a further object of this invention to describe a ground-referenced scheme for measuring the current in the actual switching devices. It is a further object to make this current responsive to device temperature, so that larger currents can safely be handled at normal temperatures, but automatically reduced as the transistor die overheats.

Note that all bridge currents flow either in Q17 in series with Q21 or in Q18 in series with Q20. Therefore it is necessary only to monitor ground-referenced devices Q18 and Q21 in order to see all currents flowing in the bridge. Therefore each lower device is monitored by an identical circuit.

A key requirement is to monitor voltage across the FET only when it is turned "on" and to disregard the off-voltage, which is normally equal to Vcc. By properly processing the sampled on-voltage, a signal proportional to the current through the device can be obtained, which may be used to prevent the input signal from exceeding a certain threshold.

The gate drive signal for Q18 is connected via D22 and Zener D21 such that R73 is pulled high only when the gate drive signal approaches full value. At this time, Q18 is expected to be fully "on" and its voltage is of interest. D25 is pulled low by Q18, pulling R73 one diode drop above the voltage across Q18. This voltage is coupled via R75 to C51, quickly bringing it into alignment with the measured voltage. When Q18 gate drive begins to go low, R73 is disconnected by D22, and therefore, the rise in voltage at the anode of D25, when Q18 turns off, is ignored. The voltage deposited on C51 therefore remains in place, effectively creating a "sample and hold" system that retains the voltage measurement for the entire switching period. R76 is adjusted to diminish this voltage with a slope similar to the switching current in the output inductor, thus creating an accurate analog of the actual output current. Q16 translates this voltage to a current, and its junction voltage is subtracted from the voltage added by D25, thereby creating a current through R72 that tracks the voltage on Q18 without significant junction voltage variables. A similar cell is connected to Q21.

Each cell's output, from Q16 and Q19, is connected to respective detectors Q13, Q15, whose emitters are held at a certain threshold by R69, R70, Q14, such that output currents above this threshold are coupled as additional negative feedback to the appropriate global feedback nodes, thus preventing further increase of signal in the amplifier. The exact threshold is adjusted by R55, and R62. As overcurrent feedback occurs, this draws the same currents thru Q14, and when voltage on R58 exceeds 0.6V, Q11 turns on, raising the voltage on C41 to a muting threshold determined within the Muting Control block. R50, R53 and C41 set a time delay so that minor excursions into current limiting, as might occur at certain audio frequencies and cabinet tunings, do not unnecessarily trigger muting.

It will be appreciated that, by effectively limiting the on-voltage drop across the power devices, the desired reduction of current limits at elevated temperatures is automatically gained. As the die heats up, the on-resistance increases, and therefore the allowable current for a given on-voltage is reduced. This correspondingly reduces associated switching loss, thereby reducing total thermal stress automatically as the device overheats.

It should be apparent that known techniques can be used to detect gross overvoltages such as filter ringing, which can also trigger protective muting. The Muting Control block can also be made responsive to internal temperature measurements, as well as remote commands to shut down the amplifier. It should further be apparent that the amplifier voltages, clip signals, and detected current signals can be connected by any convenient method to auxiliary processing circuitry, of analog or digital form, which can then be used to perform various further signal manipulations to enhance performance and improve protection. Such manipulations are beyond the scope of this invention, but the availability for external use of the signals disclosed within is a part of the scope of this invention.

The disclosed embodiments comprise multiple individual improvements operating advantageously as a total system. Class-D switching occurs at a low and fixed frequency, using standard components, with audio performance improvements through adaptation of internal error correction. By permitting 100% modulation, maximum output power is obtained, and a simple clip-detecting scheme is possible. Modifications are shown to permit safe and effective operation of a half-bridge and full-bridge with a single main supply reservoir, thus obtaining useful allocation of output power, while enabling the use of a simplified power supply. Power supply improvements include simplification and high efficiency, while meeting the particular system requirements of this scheme.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof.

Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

The teachings of the invention provided herein can be applied to other systems, not necessarily the system described above. The elements and acts of the various embodiments described above can be combined to provide further embodiments.

Changes can be made to the invention in light of the above Detailed Description. While the above description describes certain embodiments of the invention, and describes the best mode contemplated, no matter how detailed the above appears in text, the invention can be practiced in many ways. Details of the compensation system described above may vary considerably in its implementation details, while still being encompassed by the invention disclosed herein.

As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

I claim:

1. A Class-D audio power amplification method, wherein about 80% of the power is delivered to a low-frequency driver using a full-bridge and about 20% of the power is delivered to a high-frequency driver using a half-bridge, and wherein the full-bridge and the half-bridge operate from a common power supply reservoir, the method comprising:

generating a flat-topped rectangular switching waveform whose peak-to-peak value is maintained at a regulated level;

maintaining a predictable voltage on at least one secondary capacitor reservoir by passing the generated waveform through a high frequency isolation transformer, with one or more secondary windings whose outputs are peak-to-peak rectified by high frequency diodes, wherein each secondary independently rectifies one square-wave voltage substantially undisturbed by loading of other secondaries, and wherein the waveform need not have any particular high-low duty cycle; and Reducing speed of up-down transitions of the switching waveform.

2. In the method of claim 1, reducing the generation of high frequency harmonics and EMI by reducing speed of transitions, wherein a current only flows while the waveform is at its peak voltage and not during high-low transitions.

3. A power conversion system for Class-D amplification configured to perform envelope-rectification wherein a regulated peak-to-peak voltage maintains a predictable voltage on one or more isolated DC reservoirs without using significant series inductance, and configured to perform active-clamping wherein the regulated peak-to-peak voltage and a constrained high-low duty cycle produces a constantly-running primary switching waveform, the power converter comprising:

a high frequency isolation transformer, with an air gap core, set to yield a predictable value of shunt inductance, and wherein a first end of the transformer primary winding is coupled to an off-line DC reservoir;

a first switching transistor configured to couple a second end of the transformer primary winding to a low end of the DC reservoir;

a second reservoir clamping the primary winding voltage and establishing a "boost voltage," maintainable at a set voltage by varying an on/off ratio of the first switching transistor;

a shunt capacitance of sufficient amount, placed across the transformer primary, such that an inductive current stored at the end of each switching period is sufficient to produce a transition to an opposite rail with a predictable, moderate dv/dt in the shunt capacitor to obtain gradual switching transitions without dissipative currents in switching transistors.

4. The power conversion system of claim 3, wherein the first end of the transformer primary winding coupled to an off-line DC reservoir is at 200V to 400V, and the peak-to-peak voltage is about 520V.

5. The power conversion system of claim 3, wherein active-clamping is implemented by replacing a diode clamp with a second switching transistor that is controlled in alternation with the first switching transistor to clamp any residual amount of uncoupled energy resulting from a leakage inductance.

6. The power conversion system of claim 3, wherein the active clamping is controlled such that:

the first switch is turned off and the primary winding voltage flies up to the boost reservoir voltage, whereupon clamping current flows backwards through an intrinsic diode of the second switch into the boost reservoir;

the second switch is turned on after a relatively short period and assumes a bi-directional low-resistance state, wherein the boost reservoir voltage climbs as the leakage energy is discharged into the reservoir and the reservoir voltage exceeds the voltage reflected back from the secondary winding, as clamped by the secondary winding rectifiers into the secondary reservoirs;

the boost reservoir is discharged until it matches the reflected output voltage, while adding to the energy reaching the load, wherein the voltage of the boost reservoir tracks the output voltage;

the second switch is turned off when the current in the primary shunt inductor is reversed and the primary voltage is carried back to zero; and the first switch is turned on to begin a next cycle.

7. The power conversion system of claim 3, wherein the voltage of the boost reservoir is used as a primary-side reference voltage for a regulator control system.

8. A power conversion method comprising:

coupling a first end of a high frequency isolation transformer primary winding to an off-line DC reservoir;

sustaining substantial DC current in the primary without saturating, by providing the transformer core with an air gap;

reducing series inductance;

ramping up the primary winding current by configuring a first switching transistor to couple a second end of the high frequency isolation transformer primary winding to a low end of the DC reservoir;

increasing the primary winding voltage to a level higher than the DC reservoir, resembling a boost converter, by turning off the first switching transistor after a predetermined interval;

establishing a boost-voltage, which is maintained at a set voltage by varying an on/off ratio of the first switching transistor, by clamping the voltage to a second reservoir;

producing a predictable peak-to-peak voltage by obtaining a desired rectangular on-off waveform constrained between the low side of the DC reservoir and the boost voltage of the second reservoir, as the switching activity continues;

maintaining predictable voltages on one or more isolated secondary capacitors by rectifying the voltage waveform, which is coupled through transformer windings on the secondary side;

obtaining relatively gradual switching transitions without dissipative currents in the switching transistors by producing a transition to an opposite rail with a predictable moderate dv/dt in an appropriately sized shunt capacitance across the transformer primary, wherein dv/dt is caused by an inductive current stored at the end of each switching period; and a configuration wherein:

a voltage on the boost reservoir is maintained by a controller by using a normal boost-converter control function;

the second reservoir is loaded by coupling through the high frequency isolation transformer into secondary-side reservoirs, wherein the boost reservoir voltage is coupled to the secondary reservoir voltages and track together.

9. The method of claim 8, wherein the current through the shunt capacitor is rectified and used to power a controller circuitry.

10. The method of claim 8, wherein duty cycle of the switching waveform is varied within limits, by a primary-side controller to maintain a specified voltage on the boost reservoir.

11. The method of claim 8, wherein the off-line voltage and boost voltage remain within about 4:1 ratio such that the high-low ratio of the switching waveform remains within these limits and peak currents remain reasonable.

12. The method of claim 8, wherein the rectified offline voltage is lightly filtered, and the boost converter is operated in such a manner as to perform active power factor correction of the currents from the AC mains.

13. A Class-D audio power amplifier comprising a full-bridge and a half-bridge operating from a common power supply reservoir, wherein the reservoir is supplied by:
   a high frequency isolation transformer, wherein transformer core is provided with an air gap to sustain substantial DC current in primary winding without saturating and is set to yield a predictable value of shunt inductance, and wherein a first end of the transformer primary winding is coupled to an off-line DC reservoir;
   a first switching transistor configured to couple a second end of the transformer primary winding to a low end of the DC reservoir to ramp up current in the primary winding of the transformer, wherein the first switching transistor is turned off after a certain interval to fly up the primary winding voltage to a level higher than the off-line reservoir, resembling a boost converter;
   a second reservoir clamping the primary winding voltage and establishing a "boost voltage," maintainable at a set voltage by varying an on/off ratio of the first switching transistor, wherein:
      the rectangular on-off waveform is constrained between the low side voltage of the DC reservoir and the boost voltage of the second reservoir, producing a predictable peak-to-peak voltage;
      the rectangular on-off waveform, coupled through the windings of the transformer, is rectified on the secondary side of the transformer; maintaining predictable voltages on one or more isolated secondary capacitors; and
      duty cycle of the waveform may be varied, within limits, by a primary-side controller, as required to maintain a specified voltage on the second reservoir against variations of an AC voltage, without affecting the rectified voltage on the secondary side;
   a shunt capacitance of sufficient amount, placed across the transformer primary, such that an inductive current stored at the end of each switching period is sufficient to produce a transition to an opposite rail with a predictable, moderate dv/dt in the shunt capacitor to obtain gradual switching transitions without dissipative currents in switching transistors.

14. The power amplifier of claim 13, wherein an "active clamp" is further included in the power supply by replacing a diode clamp with a second switching transistor that is controlled in alternation with the first switching transistor to clamp any residual amount of uncoupled energy resulting from a leakage inductance.

15. The power amplifier of claim 14, wherein the active clamp is controlled such that:
   the first switch is turned off and the primary winding voltage flies up to the boost reservoir voltage, whereupon clamping current flows backwards through an intrinsic diode of the second switch into the boost reservoir;
   the second switch is turned on after a relatively short period and assumes a bi-directional low-resistance state, wherein the boost reservoir voltage climbs as the leakage energy is discharged into the reservoir and the reservoir voltage exceeds the voltage reflected back from the secondary winding, as clamped by the secondary winding rectifiers into the secondary reservoirs;
   the boost reservoir is discharged until it matches the reflected output voltage, while adding to the energy reaching the load, wherein the voltage of the boost reservoir tracks the output voltage;
   the second switch is turned off when the current in the primary shunt inductor is reversed and the primary voltage is carried back to zero; and
   the first switch is turned on to begin a next cycle.

16. The power amplifier of claim 13, wherein the voltage of the boost reservoir is used as a primary-side reference voltage for a regulator control system.

17. The power amplifier of claim 13, wherein the current through the shunt capacitor is rectified and used to power the controller circuitry.

18. A clocked half-bridge Class-D audio amplification method for a Class-D amplifier, the method comprising:
   synchronizing at least a part of processes by a system clock signal;
   forming a triangular signal by integrating the clock signal;
   pulse-width modulating (PWM) the triangular signal, by a high speed comparator, into a variable duty cycle square signal, using an audio input signal;
   integrating the modulated pulses;
   holding the amplifier in a muting state for a predetermined period wherein switching is disabled;
   raising an output voltage gradually to an operating point during the holding period to avoid large turn-on transient as a result of an average DC voltage appearing abruptly at an onset of switching;
   resuming switching after holding period;
   feeding back a half-bridge output to an amplifier input;
   feeding back from the switched output to the integrator to minimize errors;
   decoupling the average DC voltage of the clock signal;
   decoupling DC content of the output feedback;
   decoupling any DC offset from the audio input section;
   maintaining the average voltage at ground; and
   wherein the DC voltage of the comparator input stands substantially at zero, and the PWM signal averages substantially 50% on/off at idle, with excursions from 0 to 100% as driven by the audio input signal, and wherein the substantially 50% idle condition substantially centers the switched waveform between ground and +Vcc, ensuring substantially symmetrical peak output voltages regardless of Vcc voltage.

19. The audio amplification method of claim 18, wherein, for amplifiers that are allowed to reach full modulation, clipping is detected and a user is alerted that the rated power has been exceeded.

20. The audio amplification method of claim 18, wherein "overcurrent" signals are fed back to a global feedback node and prevent excessive stress, and wherein an overcurrent flag is delivered to a muting control block that delivers a muting signal after a pre-determined interval.

21. The audio amplification method of claim 18, wherein switching may start and stop without appreciable transients by causing output switch transitions to occur halfway through each clock pulse.

22. A clocked full-bridge Class-D audio amplification method for a Class-D amplifier that includes a pair of half-bridge switching sections, the method comprising:
   connecting a load differentially between driven outputs of the pair of half-bridge switching sections;
   synchronizing at least a part of processes by a system clock signal;
   forming a triangular signal by integrating the clock signal;

pulse-width modulating (PWM) the triangular signal, by a high speed comparator, into a variable duty cycle square signal, with complementary output phases, using an audio input signal;

integrating the modulated pulses;

holding the amplifier in a muting state for a predetermined period wherein switching is disabled;

resuming switching after holding period;

feeding back a differential signal from the full-bridge output to differential amplifier inputs;

feeding back a differential signal from the switched output to the integrator to minimize errors;

decoupling an average DC voltage of the clock signal;

decoupling DC content of the output feedback;

decoupling any DC offset from the audio input section;

maintaining the average differential output voltage substantially at zero by use of a DC servo circuit; and wherein the DC voltage of the comparator input stands substantially at zero, and the PWM signal averages substantially 50% on/off at idle, with excursions from 0 to 100% as driven by the audio input signal, and wherein the substantially 50% idle condition substantially centers the switched waveform between ground and +Vcc, ensuring substantially symmetrical peak output voltages regardless of exact Vcc voltage, and ensuring substantially zero average differential voltage across the load.

23. The audio amplification method of claim 22, wherein, for amplifiers that are allowed to reach full modulation, clipping is detected and a user is alerted that a rated power has been exceeded.

24. The audio amplification method of claim 22, wherein "overcurrent" signals are measured across both low-side switching devices, and fed back to a global feedback node to prevent excessive stress, and wherein an overcurrent flag is delivered to a muting control block that delivers a muting signal after a pre-determined interval.

25. The audio amplification method of claim 22, wherein switching may start and stop without appreciable transients by causing output switch transitions to occur halfway through each clock pulse.

* * * * *